United States Patent
Kawakita et al.

(10) Patent No.: US 8,355,421 B2
(45) Date of Patent: Jan. 15, 2013

(54) VERTICAL-CAVITY SURFACE EMITTING LASER

(75) Inventors: Yasumasa Kawakita, Tokyo (JP); Kageyama Takeo, Tokyo (JP); Hitoshi Shimizu, Tokyo (JP)

(73) Assignee: Furukawa Electric Co., Ltd, Tokyo (JP)

(*) Notice: Subject to any disclaimer, the term of this patent is extended or adjusted under 35 U.S.C. 154(b) by 50 days.

(21) Appl. No.: 12/560,875

(22) Filed: Sep. 16, 2009

(65) Prior Publication Data

US 2011/0064107 A1    Mar. 17, 2011

(51) Int. Cl.
*H01S 5/10* (2006.01)
*H01S 5/183* (2006.01)
*H01S 5/323* (2006.01)

(52) U.S. Cl. ........... 372/45.011; 372/50.124; 372/50.11; 372/99

(58) Field of Classification Search ............. 372/45.011, 372/50.11, 50.124, 99
See application file for complete search history.

(56) References Cited

U.S. PATENT DOCUMENTS

| 6,813,295 | B2 * | 11/2004 | Takeuchi et al. ........... 372/45.01 |
| 2002/0027935 | A1 * | 3/2002 | Anayama ........................ 372/46 |
| 2002/0150135 | A1 * | 10/2002 | Naone et al. .................... 372/45 |

FOREIGN PATENT DOCUMENTS

| JP | 06-037355 | | 2/1994 |
| JP | 06037355 | * | 2/1994 |
| JP | 10-173295 | | 1/2000 |
| JP | 2005252111 | * | 9/2005 |
| JP | 2005-252111 | | 3/2007 |

* cited by examiner

*Primary Examiner* — Yuanda Zhang
*Assistant Examiner* — Michael Carter
(74) *Attorney, Agent, or Firm* — Turocy & Watson, LLP

(57) ABSTRACT

A vertical cavity surface emitting laser element as described herein can suppress of any dislocation, when a distributed Bragg reflector (DBR) mirror is formed on the onto a substrate (1). The vertical cavity surface emitting laser can be designed so that an average of strain in the DBR mirror (2) and a layer thickness of the DBR mirror (2) are in reference to a curvature of the substrate (1) in order to satisfy a predetermined condition, and then nitrogen can be added into the DBR mirror (2) with a composition that corresponds to a designed average of strain in the DBR mirror (2). For example, the average composition of nitrogen can be designed to be between 0.028% and 0.390%.

2 Claims, 8 Drawing Sheets

VERTICAL-CAVITY SURFACE EMITTING LASER

BACKGROUND OF THE INVENTION

1. Field of the Invention

The present invention relates to a vertical cavity surface emitting laser element that comprises: a first multilayer film on a lower side of the vertical cavity surface emitting laser element and a second multilayer film on an upper side of the vertical cavity surface emitting laser. The first multilayer film includes a first reflecting mirror that is formed by exploiting a difference in index of refraction between a first layer of the first multilayer film and a second layer of the first multilayer film. The second multi-layer film includes a second reflecting mirror, which is formed by exploiting a difference in index of refraction between a first layer of the second multilayer film and a second layer of the second multilayer film.

2. Description of the Related Art

A surface emitting laser element of a vertical cavity type (VC-SEL: referred to as a surface emitting laser element hereinafter) can be utilized as a light source (e.g., an optical interconnection) in optical communication applications. Please refer to Japanese Patent Application Publication No. 2005-252111 (Patent Document 1) for further applications of surface emitting lasers. A surface emitting laser element can emit laser light in a direction vertical to a substrate of the surface emitting laser element. Due to this property, the surface emitting laser element can be arrayed with other surface emitting laser elements on the same substrate. Advantages of such surface emitting laser elements include, for example, the ability to perform a laser oscillation with a lower threshold electrical current a lower power consumption as lower compared to other conventional laser elements due to a smaller volume of an active layer of surface emitting laser elements compared to other conventional laser elements. Furthermore, in connection with the surface emitting laser element, a distributed Bragg reflector (DBR) mirror can be utilized to configure a resonator in accordance with the surface emitting laser element.

When a DBR mirror is accumulated onto a substrate, dislocations occur due to a lattice mismatch between the substrate and the DBR mirror, and hence, a reliability of the surface emitting laser element is decreased. Previously, it has been proposed that in order to decrease the dislocation, a surface emitting laser element can include a substrate with added indium (In) and decreased a curvature (refer to Patent Document 1), or a surface emitting laser element with added nitrogen, which maintains a lattice match between the substrate and the DBR mirror (refer to Japanese Patent Application Publication No. H10 (1998) 173295 (hereinafter Patent Document 2) and Japanese Patent Application Publication No. H06 (1994) 037355 (hereinafter Patent Document 3), or the like.

However, a problem with the surface emitting laser element in accordance with Patent Document 1 is that it is difficult to add the surface emitting laser element uniformly as it into the substrate. Moreover, Patent Document 1 does not mentioned a specific amount of nitrogen that enables the surface emitting laser element to decrease occurrences of dislocation. Although both Patent Document 2 and Patent Document 3 mention an addition of nitrogen into a material of a semiconductor that is designed to configure a DBR mirror, each exhibits a problem that it is difficult to produce a surface emitting laser element in which any occurrence of dislocation can be suppressed.

And, therefore, an object in accordance with the present invention is to provide a more reliable vertical cavity surface emitting laser element that is designed to suppress any occurrences of dislocation, even when the vertical cavity surface emitting laser element includes a DBR mirror formed on a substrate.

SUMMARY OF THE INVENTION

A first aspect of a vertical cavity surface emitting laser element comprises: a substrate; a multilayer film formed on the substrate, that includes a reflecting mirror that is formed by making use of a periodic structure of between two layers of the multilayer film having different indices of refraction. For example, the index with the higher index of refraction includes Ga and As, and a the layer with the lower index of refraction includes Al and As. Above the multilayer film, the vertical cavity surface emitting laser can include an optical resonator made of a second multilayer film and comprises a second reflecting mirror The second reflecting mirror is formed by making use of a periodic structure of between two layers of the second multilayer film having different indices of refraction. The vertical cavity surface emitting laser can include an active layer that is provided between the two reflecting mirrors. The active layer generates a light emission. The lower reflecting mirror includes nitrogen there is designed to be set for between an average of strain of the reflecting mirror of the multilayered film layer at the lower side thereof and a layer thickness of the reflecting mirror of the multilayered film layer at the lower side thereof in reference to the following formula (2) for a curvature of the substrate to be satisfied with the following formula (1) in a case where the curvature of the substrate is defined here to be as (C) (µm), the average of strain of the reflecting mirror of the multilayered film layer at the lower side thereof is defined here to be as (S) (%), a thickness of the substrate is defined to be as (d) (µm), a diameter of the substrate is defined to be as (D) (inch), and the layer thickness of the reflecting mirror of the multilayered film layer at the lower side thereof is defined here to be as (T) (µm), and there is included the nitrogen in the reflecting mirror of the multilayered film layer at the lower side thereof with having a composition which corresponds to the average of strain (S) by designing to be set with making use of the formula (2) in accordance with a relationship between the average of strain and an average of the composition of the nitrogen which is included in the reflecting mirror of the multilayered film layer at the lower side thereof.

[Formula (1)]

$$|C| < 61.5 \times \left(\frac{450}{d}\right)^2 \times \left(\frac{D}{3}\right)^2 \quad (1)$$

[Formula (2)]

$$C = \frac{(27.7S - 1.48)}{0.2} \times \left(\frac{450}{d}\right)^2 \times \left(\frac{D}{3}\right)^2 \times T \quad (2)$$

The average of strain is defined to be as ((lattice mismatch of the layer with a higher index of refraction that corresponds to the substrate) times (the thickness of the layer with the higher index of refraction)+(lattice mismatch of the layer with the lower index of refraction that corresponds to the substrate) times (the thickness of the layer with the lower index of refraction)) divided by ((the thickness of the layer with the higher index of refraction)+(the thickness of the layer with the lower index of refraction)). Moreover, the average of the composition of the nitrogen is defined to be ((a composition rate of the nitrogen in the layer with the higher index of refraction) times (the thickness of the layer with the higher index of refraction)+(a composition rate of the nitrogen in the layer with the lower index of refraction) times (the thickness of the layer with the lower index of refraction)) divided by ((the thickness of the layer with the higher index of refraction)+(the thickness of the layer with the lower index of refraction)). Furthermore, the composition rate of the nitrogen is defined to be a rate of content regarding any of the elements, including nitrogen, that configure the layer with the higher index of refraction and the layer with the lower index of refraction.

Moreover, a second aspect of a vertical cavity surface emitting laser element in accordance with the present invention is characterized in that regarding the vertical cavity surface emitting laser element as described in the first aspect, the relationship between the average of strain and the average of the composition of the nitrogen (N) that is included in the lower reflecting mirror is expressed by formula (3).

[Formula (3)]

$$N = -2.4756S + 0.3409 \quad (3)$$

Further, a third aspect of a vertical cavity surface emitting laser element in accordance with the present invention is characterized in that regarding the vertical cavity surface emitting laser element as described in either one of the first aspect or the second aspect, the average of the composition of the nitrogen which is included in the lower reflecting mirror is between 0.028% and 0.390%.

Still further, a fourth aspect of a vertical cavity surface emitting laser element in accordance with the present invention is characterized in that regarding the vertical cavity surface emitting laser element as described in the third aspect, the average composition of the nitrogen which is included in the lower reflecting mirror is greater than 0.072%.

Still further, a fifth aspect of a vertical cavity surface emitting laser element in accordance with the present invention is characterized in that regarding the vertical cavity surface emitting laser element as described in the third aspect, the average composition of the nitrogen which is included in the second reflecting mirror is greater than 0.263%.

Still further, a sixth aspect of a vertical cavity surface emitting laser element in accordance with the present invention further comprises: a substrate; a lower reflecting mirror of a multilayered film layer that is formed on the substrate by making use of a periodic structure of between a layer with the higher index of refraction which is formed by making use of a chemical compound which includes Ga and As and a layer with the lower index of refraction which is formed by making use of a chemical compound which includes Al and As; an optical resonator which comprises an upper reflecting mirror of a multilayered film layer that is formed by making use of a periodic structure of between a layer with a higher index of refraction and a layer with a lower index of refraction; and an active layer, that is provided in between the first reflecting mirror and the second reflecting mirror, and that generates a light emission, wherein there is included a phosphorus in the first reflecting mirror designed to be set for between an average of strain of the first reflecting mirror and a layer thickness of the first reflecting mirror in reference to the following formula (5) for a curvature of the substrate to be satisfied with the following formula (4) in a case where the curvature of the substrate is defined here to be as (C) (μm), the average of strain of the reflecting mirror of the multilayered film layer at the lower side thereof is defined here to be as (S) (%), a thickness of the substrate is defined to be as (d) (μm), a diameter of the substrate is defined to be as (D) (inch), and the layer thickness of the reflecting mirror of the multilayered film layer at the lower side thereof is defined here to be as (T) (μm), and there is included the phosphorus in the first reflecting mirror with having a composition which corresponds to the average of strain (S) by designing to be set with making use of the formula (5) in accordance with a relationship between the average of strain and an average of the composition of the phosphorus which is included in the first reflecting mirror.

[Formula (5)]

$$C = \frac{(27.7S - 1.48)}{0.2} \times \left(\frac{450}{d}\right)^2 \times \left(\frac{D}{3}\right)^2 \times T \quad (5)$$

Here the average of strain is defined to be as ((lattice mismatch of the layer with the higher index of refraction that corresponds to the substrate) times (the thickness of the layer with the higher index of refraction)+(lattice mismatch of the layer with the lower index of refraction that corresponds to the substrate) times (the thickness of the layer with the lower index of refraction)) divided by ((the thickness of the layer with the higher index of refraction)+(the thickness of the layer with the lower index of refraction)). Moreover, the average of the composition of the phosphorus is defined here to be as ((a composition rate of the phosphorus in the layer with the higher index of refraction) times (the thickness of the layer with the higher index of refraction)+(a composition rate of the phosphorus in the layer with the lower index of refraction) times (the thickness of the layer with the lower index of refraction)) divided by ((the thickness of the layer with the higher index of refraction)+(the thickness of the layer with the lower index of refraction)). Further, the composition rate of the phosphorus is defined here to be as a rate of content regarding any of the elements that include phosphorus among all of the elements that configure the layer with the higher index of refraction and the layer with the lower index of refraction.

Still further, a seventh aspect of a vertical cavity surface emitting laser element in accordance with the present invention is characterized in that regarding the vertical cavity surface emitting laser element as described in the sixth aspect, the relationship between the average of strain and the average of the composition of the phosphorus which is included in the lower reflecting mirror (P) is expressed by making use of the following formula (6).

[Formula (6)]

$$P = -14.578S + 2.0113 \quad (6)$$

Still further, an eighth aspect of a vertical cavity surface emitting laser element in accordance with the present invention is characterized in that regarding the vertical cavity surface emitting laser element as described in either one of the sixth aspect or the seventh aspect, the average of composition of the phosphorus which is included in the lower reflecting mirror is between 0.169% and 2.309%.

Still further, a ninth aspect of a vertical cavity surface emitting laser element in accordance with the present invention is characterized in that regarding the vertical cavity surface emitting laser element as described in either one of the sixth aspect or the seventh aspect, the phosphorus in the layer at the lower side thereof having the index of refraction as lower in the lower reflecting mirror, and there is designed for the composition of the phosphorus in the lower reflecting mirror has an index of refraction between 0.338% and 4.621%.

Still further, a tenth aspect of a vertical cavity surface emitting laser element in accordance with the present invention is characterized in that regarding the vertical cavity surface emitting laser element as described in the eighth aspect, the average of the composition of the phosphorus in the lower reflecting mirror is greater than 0.410%.

Furthermore, an eleventh aspect of a vertical cavity surface emitting laser element in accordance with the present invention is characterized in that regarding the vertical cavity surface emitting laser element as described in the eighth aspect, the average of the composition of the phosphorus which is included in the lower reflecting mirror is greater than 1.551%.

The vertical cavity surface emitting laser element in accordance with the present invention, is able to suppress an occurrence of any dislocation, even when a DBR mirror is formed onto the substrate, by designing to be set for between the average of strain of the lower reflecting mirror and the layer thickness of the lower reflecting mirror in reference to the curvature of the substrate in order to be satisfied a predetermined condition, and then by performing an addition of nitrogen into the lower reflecting mirror with the composition thereof that corresponds to the designed average of strain.

The above and other objects, features, advantages and technical and industrial significance of this invention will be better understood by reading the following detailed description of presently preferred embodiments of the invention, when considered in connection with the accompanying drawings.

EXPLANATION OF REFERENCE NUMERALS

Detailed Description of the Preferred Embodiments

Figure 1:
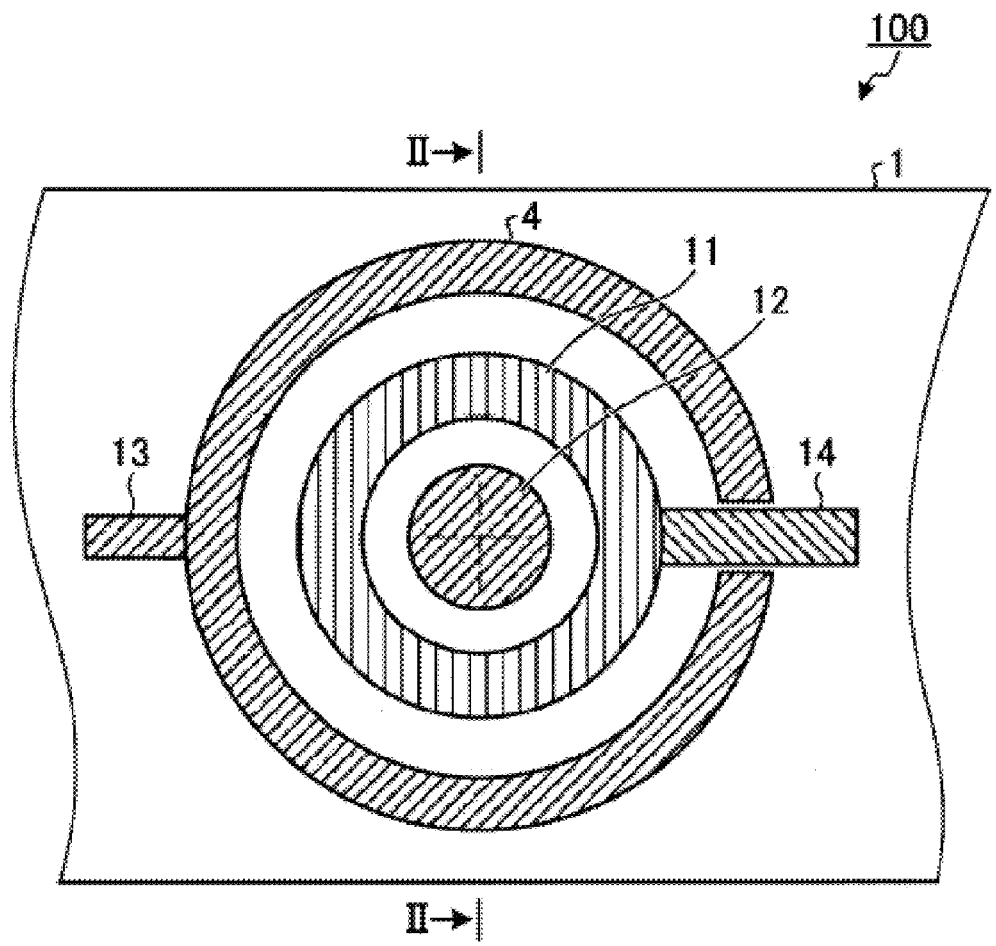
FIG. 1 is a plan view showing a configuration of a vertical cavity surface emitting laser element in accordance with the first embodiment.

Non-limiting embodiments in accordance with the present invention will be described in detail below in reference to the drawings in which like reference symbols are used throughout for each of the similar parts. In the following description, for purposes of explanation, numerous specific details are set forth in order to provide a thorough understanding of the subject innovation. It may be evident, however, that the subject matter may be practiced without these specific details. Additionally, the sizes and shapes illustrated in the drawings are merely exemplary for ease of explanation. Other variations are within the scope of this disclosure, such as a different relationship between a thickness or width of each of the layers, or a ratio of between each of the layers, or the like.

The First Embodiment

Figure 2:
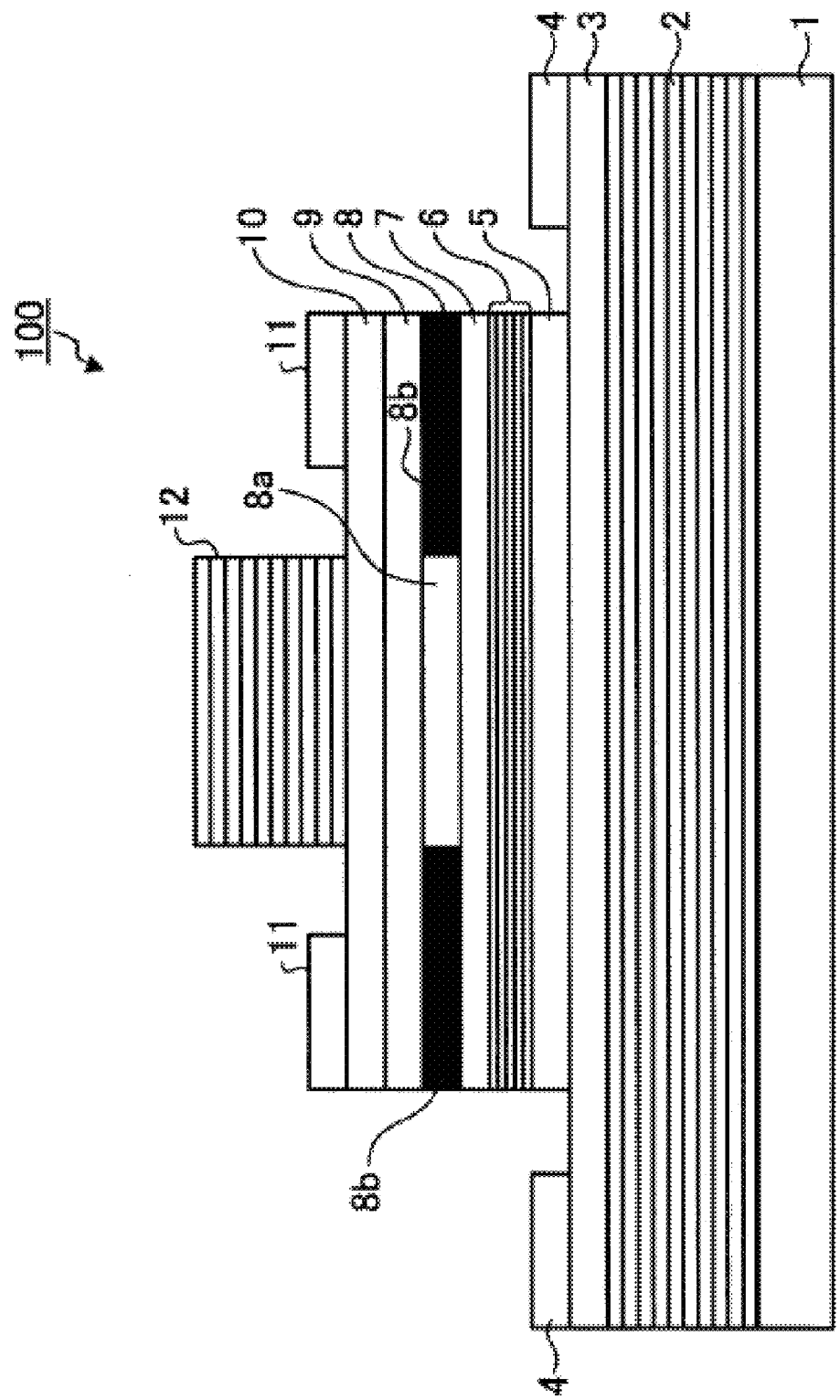
FIG. 2 is a cross sectional view showing a cross section from a point of view on a line of II-II as shown in FIG. 1.

FIG. 1 and FIG. 2 are views showing a schematic configuration of a principal part of a vertical cavity surface emitting laser element (100) according to the first embodiment, wherein FIG. 1 is a plan view and FIG. 2 is a cross sectional view from a point of view on a line of II-II as shown in FIG. 1. The vertical cavity surface emitting laser element (100) comprises: a substrate (1), such as a substrate of GaAs which has a orientation of plane as (001); a lower DBR mirror (2), that is accumulated onto the substrate (1), and that functions as a first reflecting mirror; a contact layer of an n type (3); an electrode of an n type (4); a cladding layer of an n type (5); an active layer (6); a cladding layer of a p type (7); an electrical current narrowing layer (8); a cladding layer of a p type (9); a contact layer of a p type (10); an electrode of a p type (11); and an upper DBR mirror (12), that functions as a second reflecting mirror of a multilayered film layer. Moreover, there are designed for the cladding layer of the n type (5), the active layer (6), the cladding layer of the p type (7), the electrical current narrowing layer (8) and the cladding layer of the p type (9) to be formed as individual mesa posts, that individually are formed to be as a post shape by a process such as etching or the like. Moreover, the lower DBR mirror (2) can be formed onto a buffer layer of GaAs which is accumulated onto the substrate (1).

Further, there the lower DBR mirror (2) to be formed as a mirror of a multi layered film layer of a semiconductor, in which there are accumulated a layer of GaAs which functions as a layer having an index of refraction as higher and a layer of AlAs or a layer of AlGaAs which functions as a layer having an index of refraction as lower that are assumed to be as one pair and a multilayer film includes a pluirality of these pairs. Additionally, each of the layers has a thickness so that the thickness of the lower DBR mirror (2) is λ/4n ( λ: a wavelength of emission, n: an index of refraction). Still further, nitrogen can be added to there the lower DBR mirror (2). Furthermore, nitrogen can be introduced into the layers of the lower DBR mirror via a radio frequency (an RF) plasma.

Moreover, there is designed for the contact layer of the n type (3) to be formed with making use of a material of such as an n-GaAs or the like onto the lower DBR mirror (2). Further, there is designed for the cladding layer of the n type (5) to be formed with making use of a material of such as an n-GaAs or the like onto the contact layer of the n type (3). Still further, there is designed for the cladding layer of the p type (7) to be formed with making use of a material of such as a p-GaAs or the like onto the active layer (6) which will be described in detail later. Still further, there is designed for the cladding layer of the p type (9) to be formed with making use of a material of such as a p-GaAs or the like onto the electrical current narrowing layer (8) which will be described in detail later as well. Furthermore, there is designed for the contact layer of the p type (10) to be formed with making use of a material of such as a p-GaAs or the like onto the cladding layer of the p type (9).

Moreover, the electrical current narrowing layer (8) to be formed onto the cladding layer of the p type (7), and then the same is comprised of an open part (8a) as the open part for narrowing the electrical current and a layer to be selectively oxidized (8b). Further, the electrical current narrowing layer (8) to be formed with making use of a layer to be included Al which is comprised of such as an AlAs or the like. Still further, the layer to be selectively oxidized (8b) to be formed as a ring zonal shape by being oxidized the layer to be included Al only within a predetermined zone along a face to be accumulated from a peripheral part thereof. Furthermore, the layer to be selectively oxidized (8b) has a non-conductivity as electrically, and then the same enhances a density of an electrical current at a part as directly under the open part (8a) by narrowing the electrical current to be injected from the electrode of the p type (11) and then by focusing into an inner side of the open part (8a).

Moreover, the active layer (6) has a multiple quantum well (an MQW) structure of which there are accumulated layers of a composite semiconductor as three layers thereof that is comprised of such as a GaInNAs/GaAs or the like, and then there is emitted a spontaneously emitted light therefrom with having a band of 1.3 μm, by being based on the electrical current that is injected from the electrode of the p type (11) and then that is narrowed by making use of the electrical current narrowing layer (8). Further, there is designed for the layer of GaInNAs therein to function as a quantum well, meanwhile, there is designed for the layer of GaAs therein to function as a barrier layer. Furthermore, the spontaneously emitted light therefrom to be resonated and then to be amplified in a vertical direction to each of the layers that include the active layer (6) at between the DBR mirror (2) and the upper DBR mirror (12) that are a resonator. Accordingly, laser light is emitted from an upper surface part on the upper DBR mirror (12).

Moreover, the upper DBR mirror (12) can be formed onto the contact layer of the p type (10). Further, the upper DBR mirror (12) can be formed as a mirror of a multi layered film layer of dielectric substance in which there is accumulated a composite layer of dielectric substance as a plurality of pairs that is comprised of such as an $SiN/SiO_2$ or the like. Still further, a thickness of each of the layers can be λ/4n similar to that in the lower DBR mirror (2). Furthermore, the upper DBR mirror (12) can be an accumulation of a multi layered film layer of dielectric substance which has a predetermined number of layers within a zone that includes the mesa post for instance, and there is designed to be formed by performing an etching (a process of etching) that is not for a part at right above the open part (8a) in the multi layered film layer of dielectric substance but that is for a peripheral zone as.

Moreover, there is designed for such the electrode of the p type (11) to be accumulated onto the contact layer of the p type (10), and then there is designed therefor to be formed as a ring shape for surrounding along the DBR mirror at the upper side thereof (12). Further, there is designed for the electrode of the n type (4) on the contrary thereto to be accumulated onto the cladding layer of the n type (3), and then there is designed therefor to be formed as a letter of C shape for surrounding along an accumulated face on a bottom face part of the mesa post. Still further, there are designed for such the electrode of the p type (11) and the electrode of the n type (4) to be connected as electrically to an external circuit individually which is not shown in any of the figures (such as an electrical current supply circuit or the like), with making use of an electrode of an n type for extraction (13) and an electrode of a p type for extraction (14). Still further, there may be performed the accumulation regarding each of the layers of the semiconductor by making use of a method for accumulating, such as a molecular beam epitaxy (an MBE) or an MBE with a gas source or a chemical beam epitaxy (CBE) or a metalorganic chemical vapor deposition (MOCVD) or the like. Furthermore, it is available to make use of such as a dimethylhydrazine (DMHy) or an ammonia ($NH_3$) or the like as a raw material for generating nitrogen in a case of making use of the MOCVD therefor.

Here, up to now there has been a problem that there is occurred a dislocation in a case where there is accumulated a DBR mirror at a lower side thereof on a substrate, and hence that it cannot help but being decreased a reliability of a vertical cavity surface emitting laser element thereby. Moreover, such the dislocation therein is caused due to an occurrence of a lattice mismatch for between the substrate and the DBR mirror at the lower side thereof due to a strain to be accumulated at an inner side of such the DBR mirror at the lower side thereof.

Figure 3:
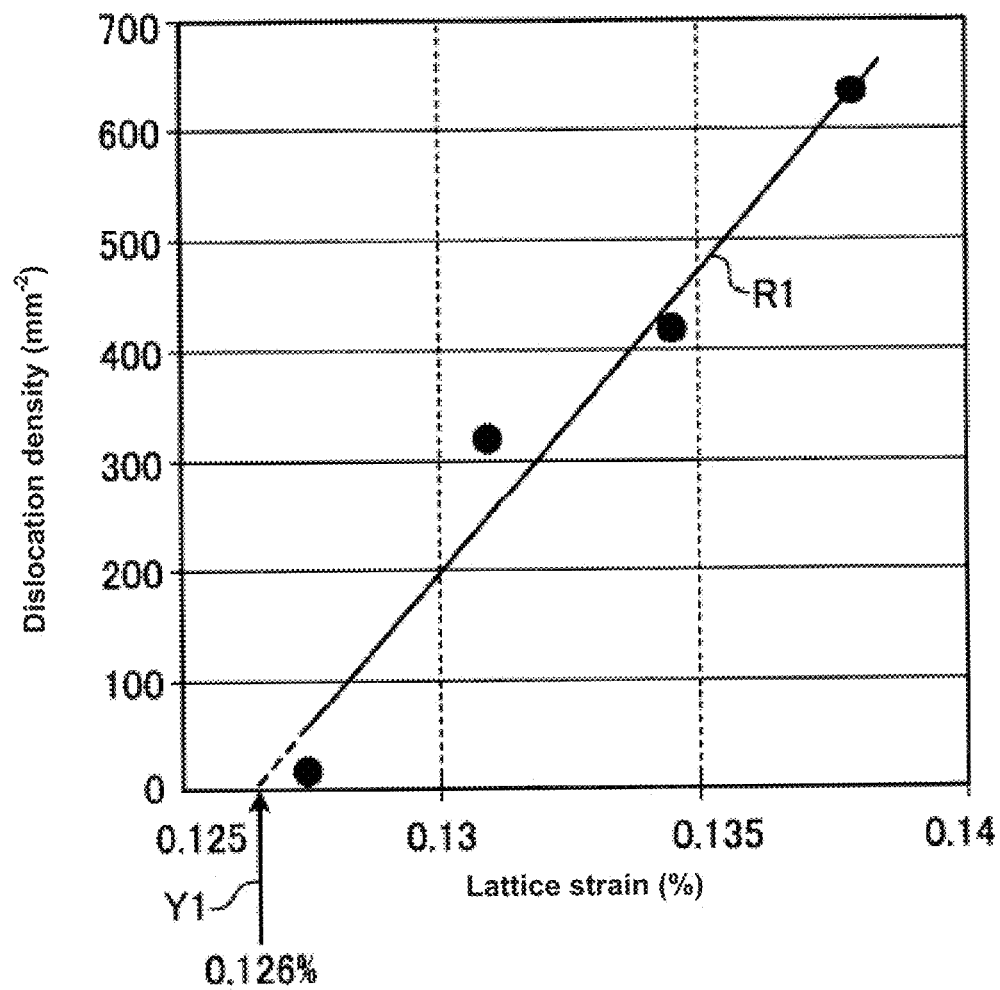
FIG. 3 is a graph showing a relationship between a Lattice strain in a DBR mirror and a dislocation density of the DBR mirror.

Lattice strain in a lower DBR mirror can be changed to eliminate a dislocation in accordance with the present first embodiment, for which there is performed a production of some samples in which there is changed the Lattice strain in each of the lower DBR mirrors. FIG. 3 is a graph showing a relationship of between a Lattice strain in a lower DBR mirror and a dislocation density thereof. Results are shown in FIG. 3. The lattice strain was varied by changing a lattice constant with varying a composition of Al in a layer of AlGaAs film layers of the lower DBR mirror Based on each of the results, the dislocation density can be determined. Moreover, the dislocation density is defined to be the number of an aggregate of the arrays of the lattice defects due to the lattice mismatch per one square millimeter which is observed and confirmed at a period of an observation for a surface thereof by making use of a microscope of the Nomarski type on which there is attached a prism of the Nomarski type onto an optical microscope.

Further, a high dislocation density of approximately 630 ($mm^{-2}$) was obtained in a case where the Lattice strain in the lower DBR is approximately 0.14%, as shown in FIG. 3. When the lattice strain is reduced, the dislocation density is reduced. That is to say, lattice strain and dislocation density exhibit a proportional relationship, and more specifically the proportional relationship as expressed in the following formula (7). Still further, there is defined for an average of strain in the lower DBR mirror to be (S) (%) in accordance with the formula (7), and the dislocation density is defined as (H) ($mm^{-2}$).

[Formula (7)]

$$H=55120S-6966.7 \tag{7}$$

In accordance with the formula (7) the dislocation density is zero ($mm^{-2}$) when the Lattice strain is 0.126% which is shown with the arrow (Y1) in FIG. 3. Still further, the dislocation can be eliminated if the Lattice strain is less than 0.126%. That is to say, a value of an upper limit is determined here to be as 0.126% regarding the Lattice strain in the lower DBR mirror for a case where the dislocation in the lower DBR mirror is eliminated. Furthermore, it becomes to be clear in accordance with the result as shown in FIG. 3 that the value of the upper limit is determined to be 0.126% regarding the Lattice strain for the dislocation to be eliminated.

There is also lower limit for a Lattice strain in a lower DBR mirror where the dislocation is eliminated. Here, there is a relationship in general that the larger a curvature of a substrate, the larger the Lattice strain in a lower DBR mirror. While there is a relationship that the smaller the curvature of the substrate, the smaller the Lattice strain in the lower DBR mirror. The value of the lower limit regarding the Lattice strain in the lower DBR mirror for a case where the dislocation is eliminated was determined by making use of the obtained relationship of between the amount of the curvature of the substrate and the Lattice strain in the lower DBR mirror.

Figure 4:
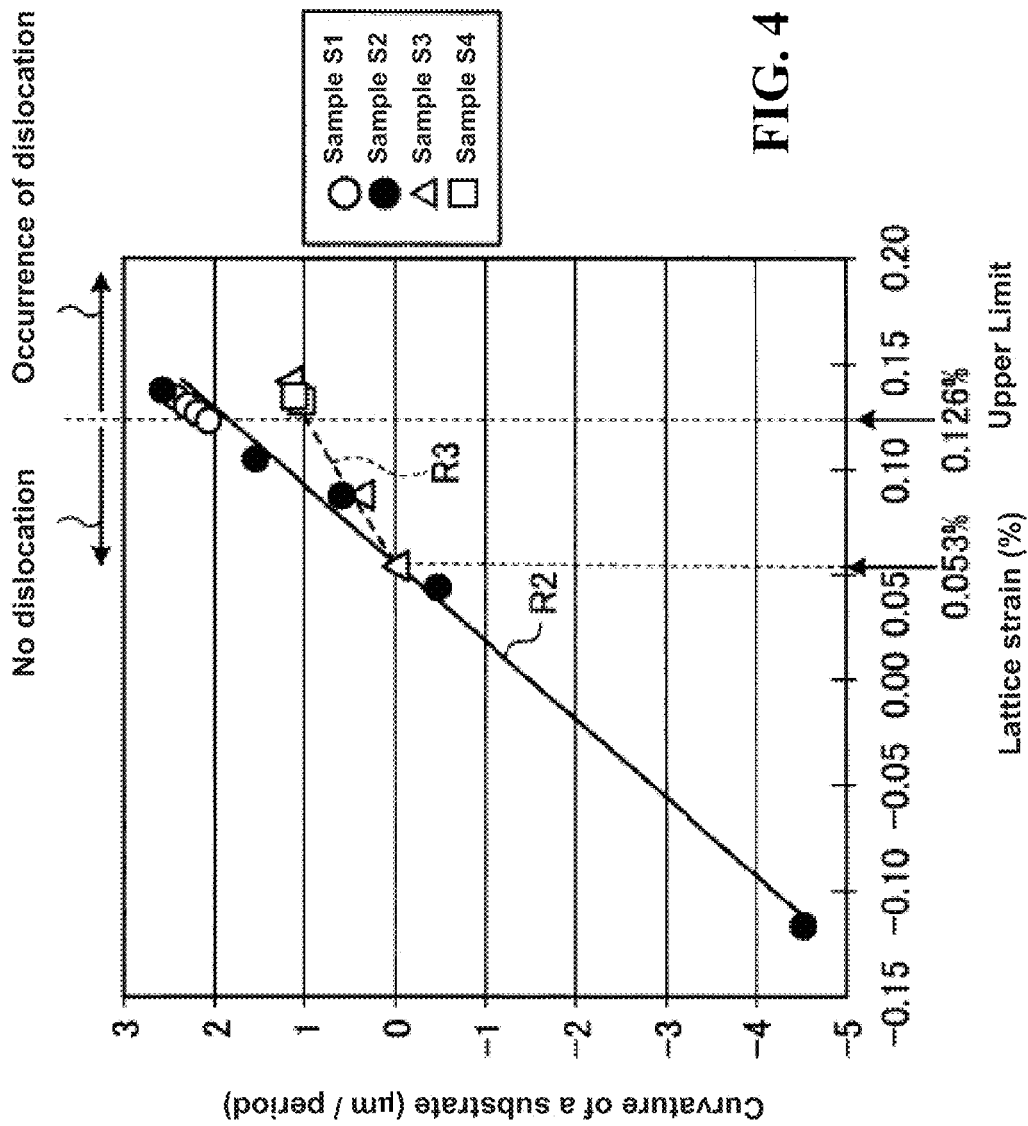
FIG. 4 is a graph showing a relationship between an average Lattice strain in a DBR mirror and an amount of curvature of a substrate.

Here, FIG. 4 is a graph for showing a relation of between a Lattice strain in a DBR mirror at a lower side thereof and an amount of curvature of a substrate. Moreover, the curvature of the substrate is defined here to be as a maximum difference of between a center of the substrate and a height of an edge of the substrate. And then there is performed a conversion from such the amount of the curvature thereof into an amount of the curvature thereof per one pair of the DBR mirrors at the lower side thereof that is indicated on the vertical axis in FIG. 4. Further, there is shown such the horizontal axis in FIG. 4 to be as an average value of the Lattice strain in the DBR mirror at the lower side thereof. Still further, there is performed a production in actual in accordance with FIG. 4: by forming each of the samples (S1) that individually comprises the DBR mirror at the lower side thereof in which there is designed for each of the Lattice strains to be individually changed by being varied each of the compositions of the Al in the individual layers of AlGaAs respectively, onto the individual substrates that individually have the thicknesses of approximately 450 μm respectively; by forming each of the samples (S2) that individually comprises the DBR mirror at the lower side thereof in which there is designed for each of the Lattice strains to be individually changed by being varied each of the compositions of nitrogen to be added into the individual layers of AlAs respectively, onto the individual substrates that individually have the thicknesses of approximately 450 μm respectively; by forming each of the samples (S3) that individually comprises the DBR mirror at the lower side thereof in which there is designed for each of the Lattice strains to be individually changed by being varied each of the compositions of nitrogen to be added into the individual layers of AlAs respectively, onto the individual substrates that individually have the thicknesses of approximately 625 μm respectively; and by forming each of the samples (S4) that individually comprises the DBR mirror at the lower side thereof in which there is designed for each of the Lattice strains to be individually changed by being varied each of the compositions of carbon to be added into the individual layers of AlAs respectively, onto the individual substrates that individually have the thicknesses of approximately 625 μm respectively. And then thereafter there is performed each of measurements of an amount of the curvature regarding each of such the substrates for the individual samples respectively. Still further, there is performed an evaluation therefor with being based on each of the results thereof by performing a conversion into an amount of the curvature thereof per one pair of the DBR mirrors at the lower side thereof. Still further, such the nitrogen and such the carbon that individually have the atomic radiuses as smaller comparing to that of As respectively, that individually are added into the corresponding layers of AlAs that individually configure the corresponding layers having the corresponding indexes of refraction as lower in the corresponding DBR mirrors at the lower side thereof. And then thereby there becomes to be decreased the lattice constant of each of the layers of AlAs by being inserted either one of such the atoms into a site of As respectively. And hence both of such the atoms become to have a function by which there becomes to be reduced the Lattice strain in the whole of the DBR mirror at the lower side thereof that comprises such the layer of AlAs as the layer having the index of refraction as lower.

As shown in FIG. 4, the straight line (R2) indicates a relationship of between the Lattice strain in the lower DBR mirror and the amount of the curvature of the substrate in the case of the thickness of the substrate as approximately 450 μm, meanwhile, the straight line (R3) indicates a relationship of between the Lattice strain and the amount of the curvature of the substrate in the case of the thickness of the substrate as approximately 625 μm on the contrary thereto. And then as shown with making use of the straight lines (R2) and (R3) in accordance with FIG. 4, there is obtained a relationship of between the Lattice strain in the DBR mirror and the amount of the curvature of the substrate for both of the cases of the thickness of the substrate as approximately 450 μm and that thereof as approximately 625 μm respectively, that the lower there is decreased the Lattice strain in the lower DBR mirror, the lower there becomes to be decreased the amount of the curvature of the substrate as proportional thereto respectively. That is to say, there is determined the proportional connection of between the Lattice strain in the DBR mirror and the amount of the curvature of the substrate, that the lower there is decreased the Lattice strain and the amount of the curvature of the substrate decreases.

As shown in FIG. 4, the Lattice strain in the lower DBR mirror is determined to be as approximately 0.053% for the amount of the curvature of the substrate to be zero in both of the cases of the thickness of the substrate as approximately 450 μm and that thereof as approximately 625 μm respectively. The amount of the curvature of the substrate increases or decreases proportionally to the Lattice strain in the lower DBR mirror with the Lattice strain of approximately 0.053% to be as a center, because there is determined the proportional connection of between the Lattice strain in the lower DBR mirror and the amount of the curvature of the substrate for both of the cases of the thickness of the substrate as approximately 450 μm and that thereof as approximately 625 μm, that is described above.

Still further, an amount of a curvature of the substrate indicates a positive value as shown in FIG. 4, that corresponds to the value of the upper limit as 0.126% for the Lattice strain in the lower DBR mirror at which the dislocation disappears in accordance with FIG. 3. The value of the upper limit as 0.126% for the Lattice strain in the lower DBR mirror at which the dislocation disappears therein becomes to be disappeared corresponds to an amount of a curvature of a substrate in a positive direction, that is to say, in a case where there becomes to be a convex shape in a direction of the accumulation onto the substrate. Still further, it is found out in accordance with FIG. 3 that the lower there is decreased the Lattice strain in the lower DBR mirror, the lower the amount of the dislocation density. Still further, the lower the amount of the curvature of the substrate, the lower the Lattice strain in the lower DBR mirror. As shown in FIG. 4, a dislocation in the case where an amount of the curvature of the substrate is larger comparing to the amount of the curvature thereof that corresponds to the Lattice strain for the value of the upper limit as 0.126%, and that no dislocation occurs in the case where an amount of the curvature of the substrate is smaller comparing to the amount of the curvature thereof that corresponds to the Lattice strain for the value of the upper limit as 0.126% on the contrary thereto. That is to say, it can be considered that the amount of the curvature thereof that corresponds to the Lattice strain for the value of the upper limit as 0.126% is assumed to be as a value of an upper limit for the amount of the curvature of the substrate at which no dislocation occurs.

Still further, the amount of the curvature thereof that corresponds to the Lattice strain for the value of the upper limit as 0.126% is determined to be as approximately 1.8 (μm/period) in the case where the thickness of the substrate is 450 μm, meanwhile, the same is determined to be as approximately 1.0 (μm/period) in the case where the thickness of the substrate is 625 μm, both of the amounts thereof individually correspond to the amount of the curvature in the cases where each of the substrates are curved in the positive direction respectively. Here, any of the substrates may be curved not only in the positive direction but also in a negative direction which is a reversed direction to the positive direction (the case where there becomes to be a convex shape to an opposite side for the direction to accumulate the layers onto the substrate). A dislocation is present in a case where a substrate is curved in the negative direction, because the larger there is curved the substrate in the negative direction, the larger there becomes to be increased in the negative direction for an amount of strain of a lattice.

Dislocation is present in the case where the substrate is curved in the negative direction, that is caused by the Lattice strain with a tendency as similar to the case where the substrate is curved in the positive direction. That is to say, it can be considered that there becomes to be occurred a dislocation in a case where there is curved a substrate in the negative direction with an amount of the curvature as larger comparing to the amount of the curvature which corresponds to the Lattice strain for the value of the upper limit as 0.126%. Still further, it can be considered that no dislocation occurs in a case where there is curved a substrate in the negative direction with an amount of the curvature as smaller comparing to the amount of the curvature which corresponds to the Lattice strain for the value of the upper limit as 0.126% on the contrary thereto. That is to say, it can be considered that a value as negative for the amount of the curvature thereof that corresponds to the Lattice strain for the value of the upper limit as 0.126% is assumed to be as a value of a lower limit for the amount of the curvature of the substrate at which no dislocation occurs. Still further, there becomes to be as approximately −1.8 (μm/period) for the value of the lower limit regarding the amount of the curvature of the substrate at which no dislocation occurs in the case where the thickness of the substrate is 450 um as more specifically thereto, meanwhile, there becomes to be as approximately −1.0 (μm/period) for the value of the lower limit regarding the amount of the curvature of the substrate at which no dislocation occurs in the case where the thickness of the substrate is 625 μm.

As shown in FIG. 4, the amount of curvature of the substrate becomes zero when the Lattice strain is assumed to be as approximately 0.053%. no dislocation occurs Shown in FIG. 4, is a lower limit of the curvature of the substrate where the thickness of the substrate is 450 μm of approximately −1.8 (μm/period), and the value of the lower limit for the Lattice strain in the lower DBR mirror is approximately −0.020%.

Still further, the relationship of between the amount of the curvature of the substrate and the Lattice strain in the lower DBR mirror depends on the thickness of the substrate as shown in FIG. 4. Still further, the amount of the curvature of the substrate depends on the diameter of the substrate. While, there is shown the curvature of the substrates as one pair thereof that configure the DBR mirror in accordance with FIG. 4 on the contrary thereto. And then the curvature of the substrate also varies with the total of the individual thicknesses of the layers for all of the pairs of the DBR mirror or the total thickness of the film layers of the DBR mirror.

Based on the relationship as shown in FIG. 4, there is performed an evaluation for the following formula (8) with taking into consideration of the thickness of the substrate, the diameter of the substrate and the total thickness of the film layers of the DBR mirror, that expresses the relationship of between the amount of the curvature of the substrate which is due to the DBR mirror and the amount of the Lattice strain in the DBR mirror. Still further, there is assumed the amount of the curvature of the substrate to be (C) (μm) in accordance with the formula (8), there is assumed the average of strain in the lower DBR mirror to be (S) (%), there is assumed the thickness of the substrate to be (d) (μm), there is assumed the diameter of the substrate to be (D) (inch), and there is assumed the layer thickness of the lower DBR mirror to be (T) (μm).

[Formula (8)]

$$C = \frac{(27.7S - 1.48)}{0.2} \times \left(\frac{450}{d}\right)^2 \times \left(\frac{D}{3}\right)^2 \times T \tag{8}$$

And then as substituting the thickness of the substrate as 450 μm and the diameter of the substrate as 3 inches and the total thickness of the film layers of the DBR mirror as 6.09 μm into the formula (8) regarding the sample that is produced in actual, there is performed the evaluation for the amount of the curvature of the substrate (C) to be as 59.3 μm that corresponds to the Lattice strain for the value of the upper limit as 0.126% at which there becomes to be disappeared any dislocation. Still further, it can be determined for a range of the amount of the curvature of the substrate (C) for which no dislocation occurs in the sample to be as −59.3 μm<C<61.5 μm, as the substrate may be curved not only in the positive direction but also in the negative direction that is described above. Still further, it is able to reassume the amount of the curvature of the substrate (C) for which no dislocation has occurred here to be as the following formula (9) in a case where there is taken into consideration of the thickness of the substrate and the diameter of the substrate because there is a variation of the amount of the curvature of the substrate for which no dislocation occurs due to the thickness of the substrate and the diameter of the substrate. Furthermore the amount of the curvature of the substrate to be as is (C) (μm) in accordance with the formula (9) as similar to that in accordance with the formula (8), the thickness of the substrate is (d) (μm), and the diameter of the substrate is (D) (inch).

[Formula (9)]

$$|C| < 61.5 \times \left(\frac{450}{d}\right)^2 \times \left(\frac{D}{3}\right)^2 \tag{9}$$

In accordance with the first embodiment, the amount of the curvature of the substrate (C) for which no dislocation occurs. And then thereby there is designed the Lattice strain in the lower DBR mirror and the total thickness of the film layers in the DBR mirror by making use of the formula (8) that is mentioned above, for the amount of the curvature of the substrate (C) to be satisfied with the formula (9). And then as a result therefrom in accordance with the present first embodiment, it becomes able to design as properly the strain (Lattice strain) in the lower DBR mirror for which no dislocation occurs and the total thickness of the film layers in the lower DBR mirror.

The thickness of the substrate is determined to be as approximately 450 μm and the diameter of the substrate is determined to be as approximately 3 inches for instance, the range of the amount of the curvature of the substrate (C) for which no dislocation occurs is determined to be as −61.5 μm<C<61.5 μm that is mentioned above. And then in a case where there is assumed the total thickness of the film layers in the DBR mirror to be as approximately 6.09 μm, it becomes able to perform an evaluation for a range of the Lattice strain (S) in the DBR mirror to be as−0.020%<S<0.126%, that satisfies the range of the amount of the curvature of the substrate (C), with making use of the formula (8). And therefore it becomes able to suppress the occurrence of any dislocation by performing a control of the Lattice strain in the DBR mirror to be within the range of higher than −0.020% but lower than 0.126%.

Next, a Lattice strain in a lower DBR mirror will be described in detail below, in order to suppress an occurrence of a dislocation. Here it is possible to perform a control of the Lattice strain in the lower DBR mirror by making use of an amount of addition of an element to be added into a site of arsenic (As) in place of the constituent element. And then by adding nitrogen with a predetermined composition thereof into a layer having an index of refraction as lower or into a layer having an index of refraction as higher which configure the lower DBR mirror thereof as more specifically thereto, there is performed the control of the Lattice strain in the lower DBR mirror in order to design for the Lattice strain to satisfy an amount of a curvature of a substrate at where there is no occurrence of any dislocation. Moreover, a nitrogen has an atomic radius as smaller comparing to that of an As. And then thereby there becomes to be decreased the lattice constant of such as a layer of AlAs or the like by performing an addition of nitrogen into the site of As in such as the layer of AlAs or the like which configures the layer having the index of refraction as lower in the DBR mirror (2). And hence the Lattice strain in total of the lower DBR mirror to be smaller. Further, the lattice constant of a layer of GaAs is decreased in a case where there is performed the addition of nitrogen into a site of As in the layer of GaAs which configures the layer having the index of refraction as higher in the DBR mirror (2) as well as needless to say. And hence it becomes able to design for the Lattice strain in total of the lower DBR mirror is smaller.

Figure 5:
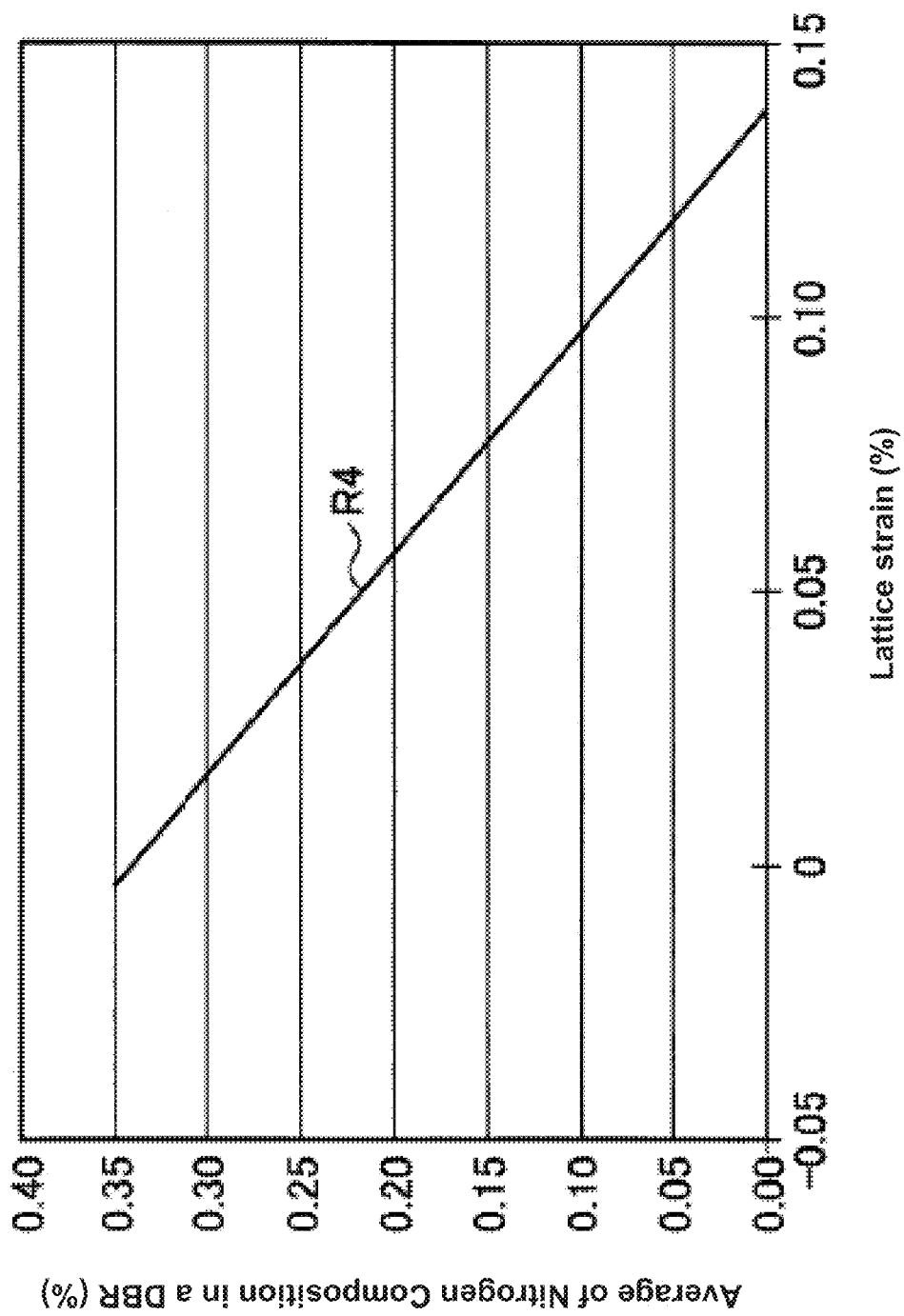
FIG. 5 is a graph showing a relationship between a Lattice strain in a DBR mirror and a composition of nitrogen to be added into the DBR mirror.

A relationship of between the composition of nitrogen to be added into the lower DBR mirror and the Lattice strain in the DBR mirror is shown in FIG. 5. Moreover, there is shown in accordance with FIG. 5 regarding a case where there is performed an arithmetic execution of the Lattice strain in the DBR mirror in a case where there is performed the individual additions of nitrogen that individually have the compositions into the layers of AlAs which configure the layer having the index of refraction as lower in the DBR mirror (2), and then where there is made an estimation of an average of the composition of the nitrogen at an inner side of the DBR mirror by making use of a ratio of between a thickness of the layer having a higher index of refraction and a thickness of the layer having a lower index of refraction.

Further, a proportional connection exists between the Lattice strain in the lower DBR mirror and the average of the composition of the nitrogen in the DBR mirror as shown by making use of a straight line (R4) in FIG. 5, and then thereby it is able to express the relationship thereof by making use of the following formula (10). Still further, there is defined for an average of strain (an average of Lattice strain) in a DBR mirror in accordance with the formula (10) is (S) (%), and a composition of nitrogen at an inner side of the lower DBR mirror is (N) (%).

[Formula (10)]

$$N = -2.4756S + 0.3409 \qquad (10)$$

Still further, a total of the layer thicknesses of the film layers in the lower DBR mirror and the Lattice strain in accordance with the first embodiment by making use of the formula (8) which is expressed above, for the amount of the curvature in the substrate (C) in order to satisfy the formula (9) that is expressed above and that is the condition where no dislocation occurs. Furthermore, there is designed for the nitrogen in accordance with the first embodiment to be included in the lower DBR mirror as uniformly in accordance with the formula (10) that is expressed above with a composition that corresponds to the average strain in the lower DBR mirror which is designed to be set by making use of the formula (8) which is expressed above. And therefore it becomes able to suppress the occurrence of any dislocation in accordance with the first embodiment by designing the average of composition of nitrogen that is included in the lower DBR mirror by making use of the formula (8) through the formula (10) that are expressed above.

Here in a case where there is selected a sample substrate in actual in which a thickness of the substrate is determined to be as approximately 450 um and a diameter of the substrate is determined to be approximately 3 inches, a range of the amount of the curvature of the substrate (C) at which no dislocation occurs is determined to be−61.5 μm<C<61.5 μm by making use of the formula (9) that is expressed above. And then a total of the layer thicknesses of the film layers in the lower DBR mirror is approximately 6.09 μm a range of the Lattice strain (S) is determined to be −0.020%<S<0.126% in order to satisfy the amount of the curvature of the substrate (C) by making use of the formula (8) that is expressed above. And hence the average of composition of the nitrogen in the lower DBR mirror is higher than 0.028% but lower than 0.390% by making use of the formula (10) which is expressed above, that corresponds to the above mentioned range of the Lattice strain (S) in the DBR mirror. Still further, it becomes able to suppress the occurrence of any dislocation in accordance with the first embodiment by performing the addition of nitrogen into the DBR mirror (2) as uniformly within the range of higher than 0.028% but lower than 0.390%. Furthermore, it may be available to perform the addition of nitrogen into the layer of AlAs that configures the layer having the index of refraction as lower in the DBR mirror (2) within a range of higher than 0.056% but lower than 0.778% for instance, in order to perform the addition of nitrogen as uniformly into the lower DBR mirror (2) within the above mentioned range of higher than 0.028% but lower than 0.390%.

And therefore it becomes possible in accordance with the first embodiment to realize the vertical cavity surface emitting laser element that there is designed as properly for suppressing the occurrence of any dislocation and then that has a higher reliability, by designing the total of the layer thicknesses of the film layers in the lower DBR mirror and the Lattice strain by making use of the formula (8) which is expressed above, for the amount of the curvature in the substrate (C) in order to satisfy the formula (9) that is expressed above and that is the condition where no dislocation occurs, and then by performing the addition of nitrogen into the lower DBR mirror with the composition thereof that corresponds to the average of strain in the lower DBR mirror which is designed to be set by making use of the formula (8) that is expressed above. Moreover, in accordance with the present first embodiment in particular, it becomes available to control as simply the amount of the addition of nitrogen to be added into the material of a semiconductor that configures the lower DBR mirror. And then thereby it becomes able to realize as simply the vertical cavity surface emitting laser element that there is designed as properly for suppressing the occurrence of any dislocation and then that has a higher reliability.

And here there is performed a production of a vertical cavity surface emitting laser element in actual for which there is designed to be set a total of the layer thicknesses of the film layers in a lower DBR mirror and a Lattice strain by making use of the formula (8) which is expressed above in order to satisfy the formula (9) that is expressed above, and then there is examined whether or not being occurred any dislocation. And then in a case where there is made use of a sample substrate in which a thickness of the substrate is determined to be approximately 450 μm and a diameter of the substrate is determined to be approximately 3 inches, where there are designed to be accumulated a layer of GaAs (93 nm approximately) and then a layer of AlAs (110 nm approximately) as a lower DBR mirror with 30 pairs thereof in order to obtain a total of the layer thicknesses of the film layers to be approximately 6.09 μm, and where there is designed to be performed the addition of nitrogen into the individual layers of AlAs to be 0.14% in order to obtain the Lattice strain to be 0.083% for instance, there becomes to be obtained for an amount of the curvature of the substrate to be 4.94 μm that satisfies the formula (9), and hence there becomes not to be occurred thereby any dislocation. Moreover, in another case where there is made use of another sample substrate in which a thickness of the substrate is determined to be approximately 625 μm and a diameter of the substrate is determined to be approximately 3 inches, where there are designed to be accumulated a layer of GaAs (93 nm approximately) and then a layer of AlAs (110 nm approximately) as another DBR mirror at a lower side thereof with 30 pairs thereof in order to obtain a total of the layer thicknesses of the film layers to be approximately 6.09 μm, and where there is designed to be performed the addition of nitrogen into the individual layers of AlAs to be 0.14% in order to obtain the Lattice strain to be 0.083% for instance, there becomes to be obtained for an amount of the curvature of the substrate to be 12.93 μm that satisfies the formula (9), and hence there is not dislocation.

Further, in another case on the contrary thereto where there is made use of another sample substrate in which a thickness of the substrate is determined to be approximately 450 μm and a diameter of the substrate is determined to be approximately 3 inches, where there are designed to be accumulated a layer of GaAs (93 nm approximately) and then a layer of AlAs (110 nm approximately) another lower DBR mirror with 30 pairs in order to obtain a total of the layer thicknesses of the film layers to be as approximately 6.10 μm, and where there is designed not to be performed any addition of nitrogen at all into the individual layers of AlAs and then thereby there is obtained the Lattice strain in the lower DBR to be as 0.138% which is higher than the value of the upper limit as 0.126% for instance, an amount of the curvature of the substrate is 1.45 μm that does not satisfy the value in accordance with the formula (9), and hence some dislocations occur. Furthermore, there is determined for each of the wavelengths of the individual lights that are emitted therefrom to be approximately 1270 nm respectively.

And therefore The occurrence of any dislocation can be suppressed in the vertical cavity surface emitting laser element by designing to be set the total of the layer thicknesses of the film layers in the lower DBR mirror and the Lattice strain by making use of the formula (8) which is expressed above, for the amount of the curvature of the substrate (C) in order to satisfy the formula (9) that is expressed above and that is the condition where no dislocation occurs, and then by performing the addition of nitrogen into the lower DBR mirror by making use of the formula (10) which is expressed above with the composition thereof that corresponds to the average of strain in the DBR mirror which is designed to be set by making use of the formula (8) that is expressed above.

Moreover, in accordance with the present first embodiment the amount of nitrogen to be added into the lower DBR mirror can be controlled by taking into consideration of an amount of the curvature of the substrate. The curvature of the substrate can increase, for example, due to a process of an accumulation of an active layer onto the lower DBR mirror.

And then in a case where there is accumulated an active layer of a compressive strain onto a lower DBR mirror, the curvature increases to approximately 15 μum. Because it is often difficult to vary the diameter of the substrate or the thickness of the substrate, it becomes to be required thereby to design for the Lattice strain in the lower DBR mirror to suppress the occurrence of any dislocation by taking into further consideration of an amount of the curvature of the substrate that increases due to the process of the accumulation of the active layer in.

Still further, an evaluation for a Lattice strain ($S_1$) which corresponds to the increase of the amount of the curvature of the substrate due to the accumulation of the active layer, by performing an arithmetic execution that will be expressed below in reference to all of the elements in accordance with the Lattice strain (S) in making use of the formula (8) which is expressed above.

$$(27.7S_0-1.48)/0.2T=(27.7S_1-1.48)/0.2T-15.$$

And in accordance with the above expressed formula, as substituting −0.020% into ($S_0$) for the value of the lower limit for the Lattice strain and as substituting 6.09 μm into (T), for the case where there is not taken into consideration of the accumulation of any of the active layers at all, it becomes able to obtain 0.640% for the Lattice strain ($S_1$) which corresponds to the increase of the amount of the curvature of the substrate due to the accumulation of the active layer. And hence it becomes to be clear thereby that a value of the lower limit for the Lattice strain becomes to be as 0.072%, that corresponds to the increase of the amount of the curvature of the substrate due to the accumulation of the active layer. Moreover, there becomes to be an average nitrogen composition of 0.072% which corresponds to 0.072% as the value of the lower limit for the Lattice strain that corresponds to the increase of the amount of the curvature of the substrate due to the accumulation of the active layer. Further, the value of the upper limit for the average of the composition of the nitrogen in the lower DBR mirror at which no dislocation occurs is here 0.390% that is performed the evaluation as above. And then thereby in the case where there is performed the accumulation of the active layer onto the lower DBR mirror (2), it becomes to be required for the average of the composition of the nitrogen in the DBR mirror to be designed as between 0.072% and 0.390% in order to suppress the occurrence of any dislocation. That is to say, in the case where there is performed the accumulation of the active layer onto the DBR mirror (2), it becomes to be required for the average of the composition of the nitrogen in the lower DBR mirror at the lower side thereof to be designed as not lower than 0.072% in order to suppress the occurrence of any dislocation. Still further, regarding a condition for dislocation free in a case where there is designed to be performed an accumulation of an active layer of a tensile strain, the strain of the DBR becomes to be dominant, and hence there becomes not to be occurred any variation thereby regarding the value of the lower limit for the composition.

Still further, it may be available in accordance with the present first embodiment further control of the amount of nitrogen to be added into the lower DBR mirror by taking into consideration of an amount of the curvature of the substrate. For example, the curvature of the substrate can increase due to an accumulation of an upper DBR mirror onto the active layer.

And then in a case where there is performed an accumulation of an active layer onto a lower DBR mirror and then where there is performed an accumulation of an upper DBR mirror onto the active layer for instance, there becomes to be increased as approximately 15 μm for the amount of the curvature of the substrate due to the accumulation of the active layer, and there becomes to be further increased as approximately 65 μm due to the accumulation of the upper DBR mirror as well. That is to say, there becomes to be increased as approximately 80 μm for the amount of the curvature of the substrate in the case where there is performed the accumulation of the active layer onto the DBR mirror and then where there is performed the accumulation of the upper DBR mirror onto the active layer. Still further, there is designed to be performed an evaluation for a Lattice strain ($S_2$) which corresponds to the increase of the amount of the curvature of the substrate due to the accumulation of the active layer and due to the accumulation of the upper DBR mirror, by performing an arithmetic execution that will be expressed below in reference to all of the elements in accordance with the Lattice strain (S) in making use of the formula (8) which is expressed above, in order to design for the Lattice strain to be set by which it becomes able to suppress the occurrence of any dislocation by taking into further consideration of the amount of the curvature of the substrate that increases in the case where there is performed the accumulation of the active layer onto the DBR mirror and then where there is performed the accumulation of the upper DBR mirror onto the active layer.

$$(27.7S_0-1.48)/0.2T=(27.7S_2-1.48)/0.2T-80.$$

And in accordance with the above expressed formula, as substituting −0.020% into ($S_0$) for the value of the lower limit for the Lattice strain and as substituting 6.09 μm into (T), for the case where there is not taken into consideration of the accumulation of any of the active layers at all, it becomes able to obtain 0.263% for the Lattice strain ($S_1$) which corresponds to the increase of the amount of the curvature of the substrate due to the accumulation of the active layer and due to the accumulation of the upper DBR mirror. And hence it becomes to be clear thereby that a value of the lower limit for the Lattice strain becomes to be as 0.263%, that corresponds to the increase of the amount of the curvature of the substrate due to the accumulation of the active layer and due to the accumulation of the upper DBR mirror. Still further, there becomes to be as 0.263% by making use of the formula (10) for an average of the composition of the nitrogen in the lower DBR mirror which corresponds to 0.263% as the value of the lower limit for the Lattice strain that corresponds to the increase of the amount of the curvature of the substrate due to the accumulation of the active layer and due to the accumulation of the upper DBR mirror. Still further, the value of the upper limit for the average of the composition of the nitrogen in the lower DBR mirror at which no dislocation occurs is here 0.390% that is performed the evaluation as above. And then thereby in the case where there is performed the accumulation of the active layer onto the lower DBR mirror (2) and then there is performed the accumulation of the upper DBR mirror, it becomes to be required for the average of the composition of the nitrogen in the DBR mirror to be designed as between 0.263% but and 0.390% in order to suppress the occurrence of any dislocation. That is to say, in the case where there is performed the accumulation of the active layer onto the lower DBR mirror (2) and then there is performed the accumulation of the upper DBR mirror, it becomes to be required for the average of the composition of the nitrogen in the DBR mirror to be designed as not lower than 0.263% in order to suppress the occurrence of any dislocation.

Figure 6:
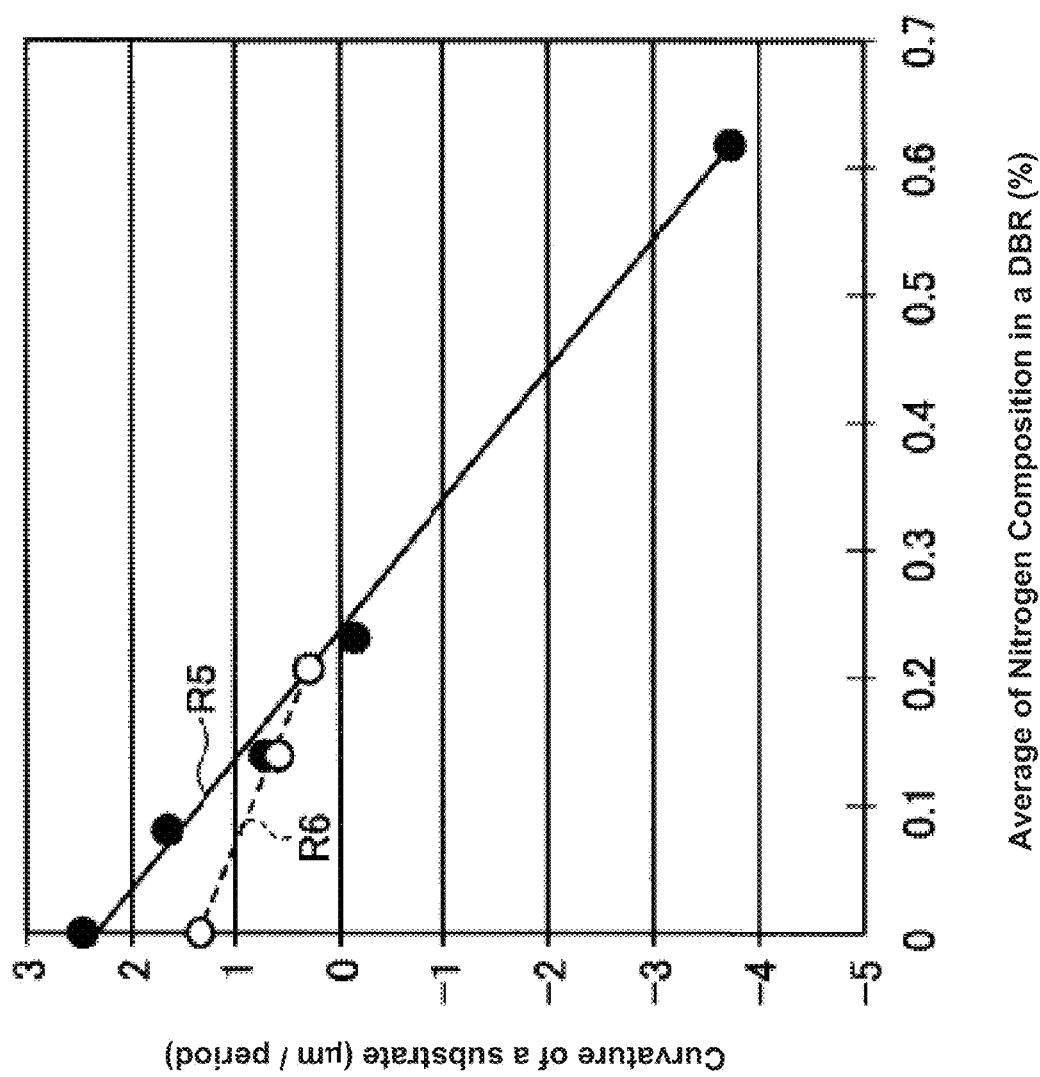
FIG. 6 is a graph showing a relationship between an average of a composition of nitrogen in a DBR mirror and an amount of curvature of a substrate.

Still further, there is shown in FIG. 6 a relationship between an average of a composition of nitrogen at an inner side of a lower DBR mirror and an amount of curvature of a substrate. Still further, a straight line (R5) in FIG. 6 corresponds to a sample in which there is designed for the substrate to be 450 μm, meanwhile, a straight line (R6) corresponds to another sample in which there is designed for the substrate to be 625 μm. And then there is having a proportional connection for between the average of the composition of the nitrogen in the lower DBR mirror and the amount of curvature of each of the substrates as shown by making use of the individual straight lines in FIG. 6. Furthermore, there is having the proportional connection for between the Lattice strain in the lower DBR mirror and the composition of nitrogen to be added into the lower DBR mirror as shown in FIG. 5. And therefore there is performed the evaluation for the value of the lower limit at which there is not suppressed the occurrence of any dislocation in each of the above descriptions by assuming that the relationship of between the Lattice strain in the lower DBR mirror and the amount of curvature of the substrate as shown in FIG. 4 is the proportional connection, as there is no problem at all in particular and it is appropriate for assuming that the relationship of between the Lattice strain in the lower DBR mirror and the amount of curvature of the substrate is the proportional connection as well, because there becomes to be the proportional connection for both of the relationship of between the average of the composition of the nitrogen in the lower DBR mirror and the amount of curvature of the substrate and the relationship of between the average of the composition of the nitrogen in the lower DBR mirror and the amount of curvature of the substrate.

The Second Embodiment

Figure 7:
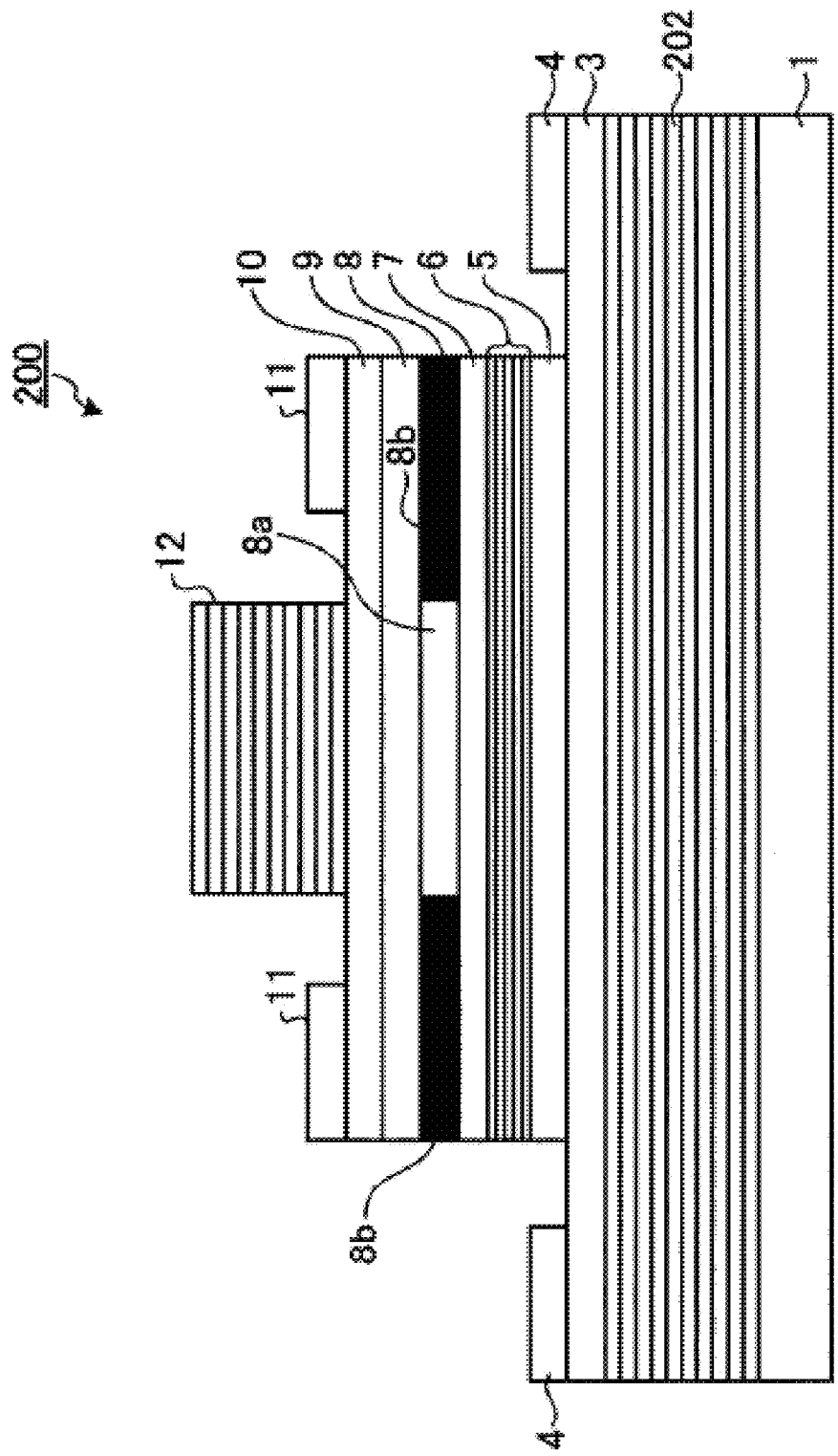
FIG. 7 is a cross sectional view showing a schematic configuration regarding a principal part of a vertical cavity surface emitting laser element in accordance with the second embodiment.

Next, the second embodiment in accordance with the present invention will be described in detail below. FIG. 7 is a cross sectional view for showing a schematic configuration regarding a principal part of a vertical cavity surface emitting laser element in accordance with the second embodiment. Moreover, such the vertical cavity surface emitting laser element in accordance with the second embodiment also has a planar configuration as similar to that in accordance with FIG. 1. Further, a vertical cavity surface emitting laser element (200) in accordance with the second embodiment comprises a configuration in which there is provided a DBR mirror at a lower side thereof (202) as shown in FIG. 7, that is in place of the DBR mirror at the lower side thereof (2) in accordance with the vertical cavity surface emitting laser element (100) as shown in FIG. 2. Still further, in accordance with such the DBR mirror at the lower side thereof (202), there is designed to be added not nitrogen but phosphorus (P) thereinto, that has a function to decrease a lattice constant thereof as similar to that with making use of nitrogen therefor. Still further, there is designed for a Lattice strain in the DBR mirror at the lower side thereof (202) to be as within a range by which it is possible to suppress an occurrence of any dislocation therein by performing a control of an amount of an addition of phosphorus that has the function to decrease the lattice constant thereof in accordance with the second embodiment.

Still further, the amount of a curvature of a substrate by which no dislocation occurs in accordance with the second embodiment as similar to that in accordance with the first embodiment. And then there is designed to be set for the Lattice strain in the lower DBR mirror (202) and for a total of the layer thicknesses of the film layers in the lower DBR mirror (202) in order to realize the amount of the curvature of a substrate by making use of the formula (8) which is expressed above, for the amount of the curvature of the substrate (C) in order to satisfy the formula (9).

And then in order to eliminate any dislocation, the Lattice strain in the lower DBR mirror (202) and the amount of the curvature of the substrate (C) for a range of the composition of phosphorus to be added into a layer having an index of refraction as lower or into a layer having an index of refraction as higher that configure the lower DBR mirror with following a description as below.

Figure 8:
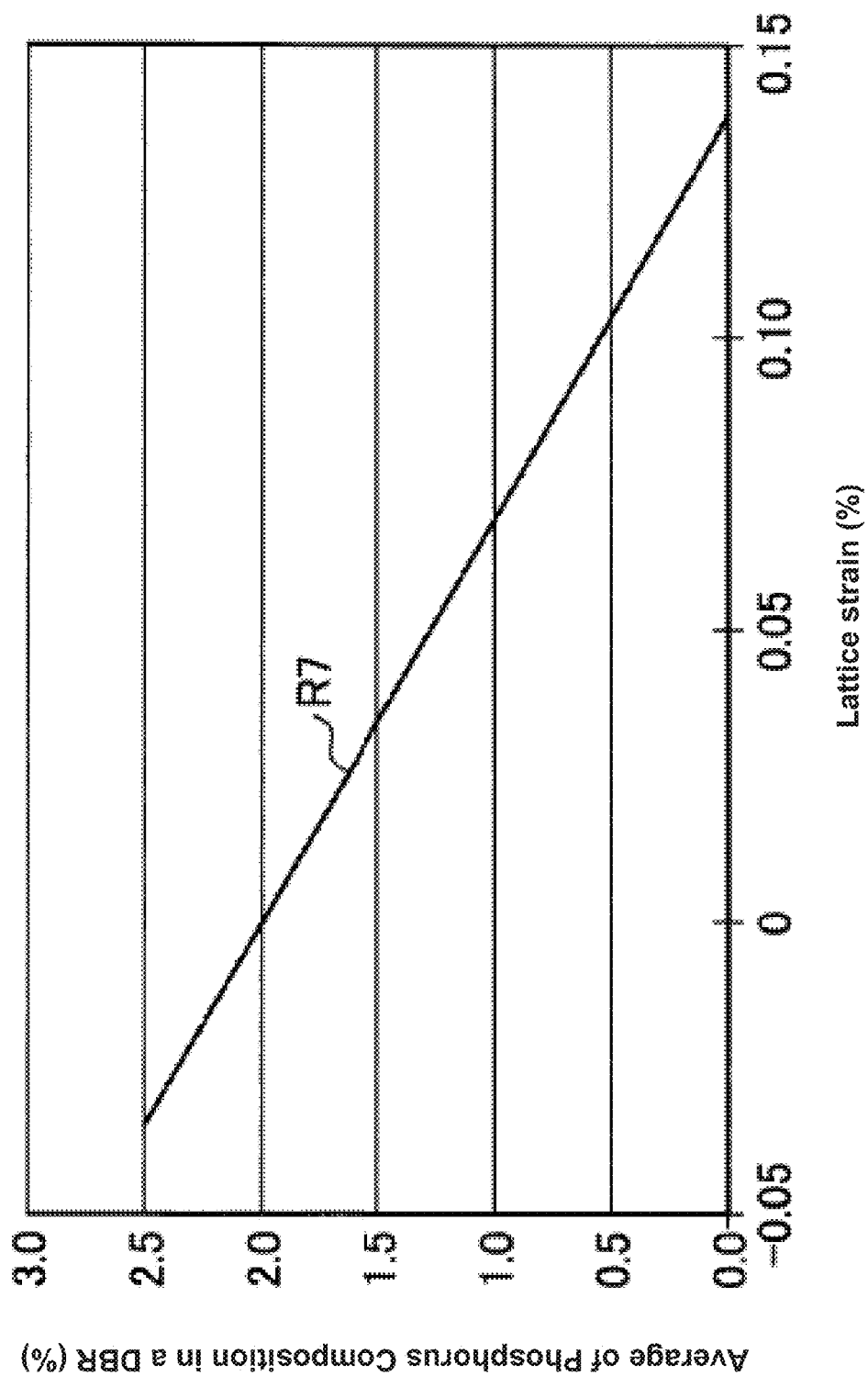
FIG. 8 is a graph showing a relationship between a Lattice strain in a DBR mirror and a composition of phosphorus to be added into the DBR mirror.

Similar to the case for the nitrogen in accordance with the first embodiment, the relationship of between the composition of phosphorus to be added into the lower DBR mirror and the Lattice strain in the lower DBR mirror. As shown in FIG. 8 is the relationship of between a Lattice strain in a lower DBR mirror and a composition of phosphorus to be added into the lower DBR mirror. Still further, there is shown in accordance with FIG. 8 regarding a case where there is performed an arithmetic execution of the Lattice strain in the DBR mirror in a case where there is performed an addition of phosphorus that has each of compositions into the layer of AlAs which configures the layer having the index of refraction as lower in the lower DBR mirror, and then where there is made an estimation of the composition of the phosphorus at an inner side of the DBR mirror by making use of a ratio of between a thickness of the layer having the index of refraction as higher and a thickness of the layer having the index of refraction as lower.

Still further, there is having a proportional connection as theoretically for between the Lattice strain in the DBR mirror and an average of the composition of the phosphorus in the DBR mirror there at as shown by making use of a straight line (R7) in FIG. 8, and then thereby it is able to express the relationship thereof by making use of the following formula (11). Still further, there is defined for an average of strain in a lower DBR mirror in accordance with the formula (11) here to be as (S) (%), and there is defined for an average of a composition of phosphorus at an inner side of the DBR mirror here to be as (P) (%).

[Formula (11)]

$$P = -14.578S + 2.0113 \tag{11}$$

Still further, there is designed a total of the layer thicknesses of the film layers in the DBR mirror and the Lattice strain in accordance with the second embodiment by making use of the formula (8) which is expressed above, for the amount of the curvature in the substrate (C) in order to satisfy the formula (9) that is expressed above and that is the condition where there is no dislocation. Furthermore, the phosphorus in accordance with the second embodiment to be uniformly included in the lower DBR mirror as uniformly in accordance with the formula (11) that is expressed above, with a composition that corresponds to the average strain in the lower DBR mirror which is designed to be set by making use of the formula (8) which is expressed above. And therefore it becomes able to suppress the occurrence of any dislocation in accordance with the second embodiment by designing an average of a composition of phosphorus that becomes to be included in the lower DBR mirror, by making use of the formula (8), the formula (9) and the formula (11) that are expressed above.

Here in a case where there is selected a sample substrate in which a thickness of the substrate is determined to be approximately 450 μm and a diameter of the substrate is determined to be approximately 3 inches, a range of the amount of the curvature of the substrate (C) at which there is no dislocation is −61.5 μm<C<61.5 μm by making use of the formula (9). A total of the layer thicknesses of the film layers in the lower DBR mirror is approximately 6.09 μ and the Lattice strain (S) in order to satisfy the amount of the curvature of the substrate (C) is −0.020%<S<0.126% according to formula (8) that is expressed above.

And hence it becomes able to perform an evaluation for the average of the composition of the phosphorus in the lower DBR mirror to be higher than 0.169% but lower than 2.309% according to formula (11) corresponding to the above mentioned range of the Lattice strain (S) in the DBR mirror. Moreover, it becomes able to suppress the occurrence of any dislocation in accordance with the second embodiment by performing the addition of phosphorus into the DBR mirror (202) as uniformly within the range of higher than 0.169% but lower than 2.309%. Further, it may be available to perform the addition of phosphorus into the layer of AlAs that configures the layer having the index of refraction lower in the lower DBR mirror (202) within a range of higher than 0.338% but lower than 4.621% for instance, without performing any addition of phosphorus into the layer of GaAs that configures the layer having the index of refraction as higher in the DBR mirror (202), in order to perform the addition of phosphorus as uniformly into the lower DBR mirror (202) within the above mentioned range of higher than 0.169% but lower than 2.309%.

The occurrence of any dislocation can be suppressed with the second embodiment similarly to that in accordance with the first embodiment, by designing the total of the layer thicknesses of the film layers in the lower DBR mirror and the Lattice strain by making use of the formula (8) which is expressed above, for the amount of the curvature in the substrate (C) in order to satisfy the formula (9) that is expressed above and that is the condition where there is not occurred any dislocation, and then by performing the addition of phosphorus into the lower DBR mirror with the composition thereof that is performed to be evaluated by making use of the formula (11) which is expressed above and that corresponds to the average of strain in the DBR mirror which is designed according to formula (8) that is expressed above.

The amount of phosphorus to be added into the lower DBR mirror can be controlled similarly to the nitrogen of the first embodiment, by taking into consideration an amount of the curvature of the substrate that increases due to a process of an accumulation of an active layer of a compressive strain onto the lower DBR mirror.

The Lattice strain as $(S_1)$ is 0.072% corresponding to the increase of the amount of the curvature of the substrate due to the accumulation of the active layer similarly to the first embodiment, by making use of the value of the lower limit for the Lattice strain as −0.0195% and the total of the layer thicknesses of the film layers in the DBR mirror thereat as 6.09 μm, for instance, assuming the amount of the curvature of the substrate is approximately 15 μm that is the increased amount in the case where there is performed the accumulation of the active layer onto the DBR mirror. And then the Lattice strain as $(S_1)$ becomes to be determined as an amount of a lower value for the Lattice strain that corresponds to the increase of the amount of the curvature of the substrate due to the accumulation of the active layer. Still further, there becomes is 0.410% by making use of the formula (11) for an average of the composition of the phosphorus in the DBR mirror which corresponds to 0.072% as the value of the lower limit for the Lattice strain that corresponds to the increase of the amount of the curvature of the substrate due to the accumulation of the active layer. Still further, the value of the upper limit for the average of the composition of the phosphorus in the DBR mirror at which there is not occurred any dislocation is here 2.29% that is performed the evaluation as above. And then thereby in the case where there is performed the accumulation of the active layer onto the lower DBR mirror (202), it becomes to be required for the average of the composition of the phosphorus in the DBR mirror to be designed as between 0.410% and 2.29% in order to suppress the occurrence of any dislocation. That is to say, in the case where there is performed the accumulation of the active layer onto the DBR mirror ($202$), it becomes to be required for the average of the composition of the phosphorus in the DBR mirror to be designed as not lower than 0.410% in order to suppress the occurrence of any dislocation. Furthermore, regarding a condition for dislocation free in a case where there is designed to be performed an accumulation of an active layer of a tensile strain, the strain of the DBR becomes to be dominant, and hence there becomes not to be occurred any variation thereby regarding the value of the lower limit for the composition.

Moreover, the amount of phosphorus to be added into the lower DBR mirror can be controlled similarly to the nitrogen of the first embodiment, by taking into consideration of an amount of the curvature of the substrate that increases due to a further process of an accumulation of an upper DBR mirror onto the active layer.

Further, the Lattice strain ($S_2$) of 0.263% corresponds to the increase of the amount of the curvature of the substrate due to the accumulation of the active layer and due to the accumulation of the upper DBR similar to the first embodiment by making use of the value of the lower limit for the Lattice strain is –0.020% and the total of the layer thicknesses of the film layers in the DBR mirror of 6.09 μm, for instance, with assuming the amount of the curvature of the substrate to be approximately 80 μm that is the increased amount with the accumulation of the active layer onto the lower DBR mirror and the accumulation of the upper DBR mirror. The Lattice strain ($S_2$) corresponds to the increase of the amount of the curvature of the substrate due to the accumulation of the active layer and then due to the accumulation of the upper DBR mirror. Still further, there becomes to be as 1.551% by making use of the formula (11) for an average of the composition of the phosphorus in the lower DBR mirror which corresponds to 0.263% for the lower limit for the Lattice strain that corresponds to the increase of the amount of the curvature of the substrate due to the accumulation of the active layer and due to the accumulation of the upper DBR mirror. Furthermore, the value of the upper limit for the average composition of the phosphorus in the DBR mirror at which there is not occurred any dislocation is here 2.29% that is performed the evaluation as above. And then thereby in the case where there is performed the accumulation of the active layer onto the DBR mirror ($202$) and then there is performed the accumulation of the upper DBR, it becomes to be required for the average of the composition of the phosphorus in the DBR mirror to be designed as between 1.551% and 2.29% in order to suppress the occurrence of any dislocation. That is to say, in the case where there is performed the accumulation of the active layer onto the DBR mirror ($202$) and then there is performed the accumulation of the upper DBR mirror, it becomes to be required for the average of the composition of the phosphorus in the DBR mirror greater than 1.551% in order to suppress the occurrence of any dislocation.

Active layer (6) can be formed with the material of GaInNAs system and that has the wavelength of emission having a band of 1.3 μm in accordance with each of the first and the second embodiments. However, it is possible to configure the active layer to exhibit a different wavelength of emission by selecting different materials. For example, AlGaInP or InGaAsP can be selected for a wavelength of emission a band of 650 nm for instance, or InGaAs has a band of 1 μm, for instance, or GaInAsP, AlGanInP or GaInNAsSb with a band of between 1.3 μm and 1.6 μm, for instance.

Further, the upper DBR mirror (12) can be comprised of the film layers of the dielectric substance in accordance with each of the first and the second embodiments. However, the upper DBR mirror (12) can be comprised of the film layers of the dielectric substance, while the other parts can be comprised of a film layer of a different semiconductor. Still further, for example of the case where there is designed for the film layers of the dielectric substance that individually configure the upper DBR mirror (12) to be formed with making use of the composite layer of the dielectric substance that is comprised of such as the $SiN/SiO_2$ or the like in accordance with each of the first and the second embodiments. However, these examples are not meant to be limiting. The film layer can be any material, such as $SiO_2$ or SiN or a-Si or AlO or MgF or ITO or TiO or any combination thereof. Still further, it is possible to form $SiO_2$ SiN and a-Si in general by a plasma CVD method, or it is possible to form $SiO_2$, a-Si, AlO, MgF, ITO and TiO by an electron beam evaporation method, or it is possible to form $SiO_2$, a-Si, AlO and ITO by a spattering method.

Furthermore, described herein above are two embodiments of the vertical cavity surface emitting laser elements (100) and (200), respectively. Each of embodiments (100) and (200) can be either a one-dimensional or a two-dimensional array.

Although the invention has been described with respect to specific embodiments for a complete and clear disclosure, the appended claims are not to be thus limited, but are to be construed as embodying all modifications and alternative constructions that may occur to one skilled in the art that fairly fall within the basic teachings herein set forth.

What is claimed is:

1. A vertical cavity surface emitting laser element, comprising:
   a semiconductor layered structure comprising:
      a GaAs substrate,
      a lower Distributed Bragg Reflector (DBR) mirror accumulated on the substrate, comprising a first multilayered film of an accumulated first layer formed of GaAs and a second layer formed of AlAs or AlGaAs, formed by utilizing a periodic structure between the first layer and the second layer, wherein the first layer has a higher index of refraction than the second layer,
      an active layer formed above the lower DBR mirror, which generates a light emission,
      a first cladding layer at a lower side of the active layer,
      a first contact layer at the lower side of the active layer,
      a second cladding layer at an upper side of the active layer, and
      a second contact layer at the upper side of the active layer,
      wherein a current path in the semiconductor layered structure includes the second contact layer, the second cladding layer, the active layer, the first cladding layer, and the first contact layer; and
   an optical resonator formed above the active layer, comprising an upper DBR mirror comprising a second multilayered film layer of dielectric substance,
   wherein the second multilayered film comprises a third layer and a fourth layer,
   wherein the upper DBR mirror is formed by utilizing a periodic structure between the third layer and the fourth layer, wherein the third layer has a higher index of refraction than the fourth layer,
   wherein nitrogen is included in the lower DBR mirror to prevent dislocation, wherein an average composition of the nitrogen in the first DBR mirror is one of (A) greater than or equal to 0.028% and less than or equal to 0.390%, (B) greater than or equal to 0.072% and less than or equal to 0.390% or (C) greater than or equal to 0.263% and less than or equal to 0.390%, wherein an average of strain of the lower DBR mirror and a thickness of the lower DBR mirror are set in reference to the following formula (2) so that a curvature of the substrate satisfies the following formula (1)

$$|C| < 61.5 \times \left(\frac{450}{d}\right)^2 \times \left(\frac{D}{3}\right)^2 \quad (1)$$

$$C = \frac{(27.7S - 1.48)}{0.2} \times \left(\frac{450}{d}\right)^2 \times \left(\frac{D}{3}\right)^2 \times T, \quad (2)$$

where C is the curvature of the substrate in units of microns, D is a diameter of the substrate in units of inches, d is a thickness of the substrate in units of microns, T is a thickness of the lower DBR mirror in microns, and S is a percent average of strain of the lower DBR mirror, wherein an average of a composition of the nitrogen corresponds to S, wherein accumulation of the active layer applies a compressive strain or a tensile strain to the lower DBR mirror, wherein, when the accumulation of the active layer applies the compressive strain, the amount of curvature of the substrate increases by about 15 μm and the lattice strain S1, corresponding to the increase in the amount of curvature of the substrate, satisfies the following formula (3)

$$(27.7 * S0 - 1.48)/0.2T = (27.7 * S1 - 1.48)/0.2T - 15 \quad (3),$$

where −0.020% is substituted for a value S0 of a lower limit of the lattice strain S1, and T is about 6.09 μm, wherein, when the accumulation of the active layer applies the tensile strain, the value of the lower limit of the lattice strain does not substantially vary and formula (3) is not used, and wherein, when the accumulation of the active layer is onto the lower DBR mirror and accumulation of the upper DBR mirror is onto the active layer, the amount of curvature of the substrate increases by about an additional 65 μm.

2. The vertical cavity surface emitting laser element of claim 1, wherein $$N = -2.4756S + 0.3409,$$

where N is an average concentration of the nitrogen.

* * * * *